(12) United States Patent
Raab et al.

(10) Patent No.: US 12,443,110 B2
(45) Date of Patent: Oct. 14, 2025

(54) OPTICAL ASSEMBLY, METHOD FOR CONTROLLING AN OPTICAL ASSEMBLY, AND PROJECTION EXPOSURE APPARATUS

(71) Applicant: Carl Zeiss SMT GmbH, Oberkochen (DE)

(72) Inventors: Markus Raab, Schillingsfuerst (DE); Andreas Raba, Niederschoenenfeld (DE); Johannes Lippert, Buch am Wald (DE); Matthias Manger, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 91 days.

(21) Appl. No.: 18/164,167

(22) Filed: Feb. 3, 2023

(65) Prior Publication Data

US 2023/0176486 A1 Jun. 8, 2023

Related U.S. Application Data

(63) Continuation of application No. PCT/EP2021/071538, filed on Aug. 2, 2021.

(30) Foreign Application Priority Data

Aug. 26, 2020 (DE) .......................... 102020210773.4

(51) Int. Cl.
*G03F 7/20* (2006.01)
*G03F 7/00* (2006.01)

(52) U.S. Cl.
CPC ................................ *G03F 7/70266* (2013.01)

(58) Field of Classification Search
CPC ............. G03F 7/70266; G03F 7/70258; G02B 26/0825
See application file for complete search history.

(56) References Cited

U.S. PATENT DOCUMENTS 6,236,490 B1 * 5/2001 Shen ...................... G02B 26/06
359/872
7,125,128 B2 * 10/2006 Novak ................ G03F 7/70266
359/849
(Continued)

FOREIGN PATENT DOCUMENTS

DE 10 2018 216 963 A1 11/2018
DE 10 2018 213 220 A1 9/2019
DE 10 2018 216 964 A1 4/2020

OTHER PUBLICATIONS

Translation of International Search Report for corresponding PCT Appl No. PCT/EP2021/071538, dated Nov. 22, 2021.
(Continued)

*Primary Examiner* — Mesfin T Asfaw
(74) *Attorney, Agent, or Firm* — Fish & Richardson P.C.

(57) ABSTRACT

An optical assembly for semiconductor lithography comprises an optical element and an actuator for deforming the optical element. The actuator is constructed from at least three sections, which include at least first and second group of sections that are controllable in each case via a controller are present. The first group serves for coarse actuation, and the second group serves for fine actuation. The controller is configured to control the groups independently of one another and the sections of a group jointly. The controller is furthermore configured to variably set the number of sections controlled jointly per group. Furthermore, the disclosure relates to a projection exposure apparatus equipped with the assembly, and to a method for controlling the optical assembly.

20 Claims, 5 Drawing Sheets

(56) References Cited

U.S. PATENT DOCUMENTS

2006/0103956 A1* 5/2006 Griffith .............. G02B 26/0825
359/845
2006/0232866 A1* 10/2006 Sai ...................... G03F 7/70266
359/849
2021/0223705 A1 7/2021 Pnini

OTHER PUBLICATIONS

German Office Action, with translation thereof, for corresponding DE Appl No. 10 2020 210 773.4, dated Feb. 25, 2021.

* cited by examiner

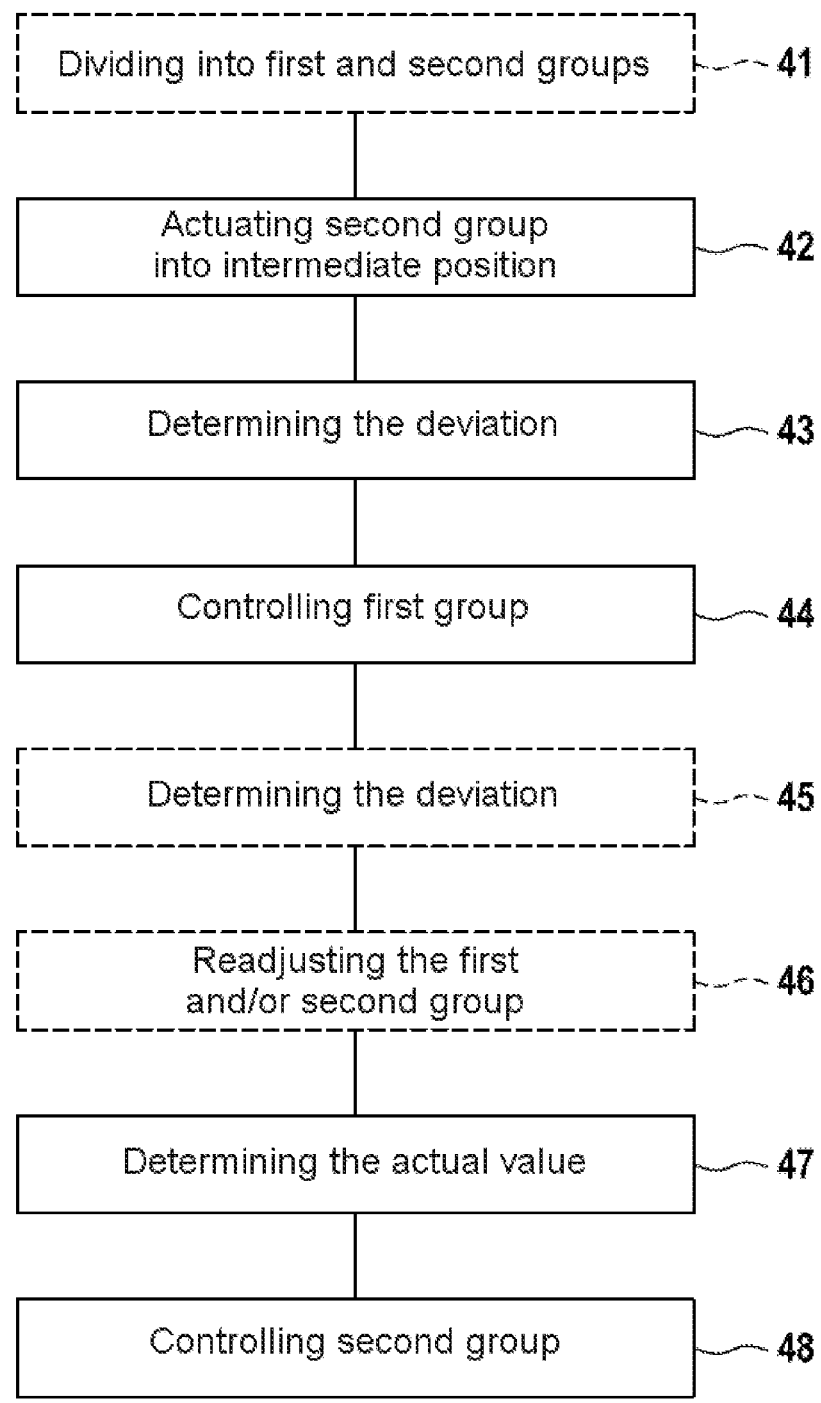

OPTICAL ASSEMBLY, METHOD FOR CONTROLLING AN OPTICAL ASSEMBLY, AND PROJECTION EXPOSURE APPARATUS

CROSS-REFERENCE TO RELATED APPLICATIONS

The present application is a continuation of, and claims benefit under 35 USC 120 to, international application PCT/EP2021/071538, filed Aug. 2, 2021, which claims benefit under 35 USC 119 of German Application No. 10 2020 210 773.4, filed Aug. 26, 2020. The entire disclosure of these applications are incorporated by reference herein.

FIELD

The disclosure relates to an optical assembly, such as an optical assembly for a projection exposure apparatus, and to a method for controlling an optical assembly. Furthermore, the disclosure relates to a projection exposure apparatus comprising an optical assembly.

BACKGROUND

Such apparatuses are used for producing extremely fine structures, such as on semiconductor components or other microstructured component parts. An aspect of the apparatuses is based on the production of extremely fine structures down to the nanometer range by way of generally reducing imaging of structures on a mask, a so-called reticle, on an element to be structured, a so-called wafer, that is provided with photosensitive material. The minimum dimensions of the structures produced are generally directly dependent on the wavelength of the light used. Recently, light sources having an emission wavelength in the range of a few nanometers, for example between 1 nm and 120 nm, for example in the region of 13.5 nm, have increasingly been used. The described wavelength range is also referred to as the EUV range.

Apart from with the use of EUV systems, the microstructured component parts are also produced using commercially established DUV systems, which have a wavelength of between 100 nm and 400 nm, for example 193 nm. As a result of the introduction of exposure methods in the EUV range, and hence the possibility of being able to produce even smaller structures, there has also been a further increase in the demands in respect of the optical correction of the DUV systems with a wavelength of 193 nm. Additionally, there is usually an increase in the throughput of each new generation of projection exposure apparatuses, independently of the wavelength, so as to increase the profitability; this typically leads to a greater thermal load and hence to more imaging aberrations caused by the heat. To correct the imaging aberrations, use can be made of optical assemblies, such as manipulators with actuators, for example, which alter the position and alignment of the optical elements or else influence the imaging properties of the optical elements, for example mirrors, by deforming the optical effective surfaces. In this case, an optical effective surface of an optical element should be understood to mean that surface which is impinged on by the electromagnetic radiation used for imaging.

In this case, temperature changes in the projection exposure apparatus do not just lead to the imaging aberrations that are to be corrected by the manipulators as already discussed above. They can also lead, in the manipulators themselves and for example in the actuators thereof, firstly to thermal deformations and secondly also to changes in the controllability of the actuators on account of changing parameters for the physical effects underlying the actuator effect, for example for the electrostrictive, piezoelectric or magnetostrictive effect.

As a result of the effects described, a fine setting—desired for example for the correction of imaging aberrations—of the actuators can be made more difficult. Furthermore, hysteresis effects of the actuator material can make it more difficult to reliably control the actuator system.

Some known approaches for realizing a fine setting which employ for example two combined actuators, a first actuator of which is used for coarse setting, with the second being used for fine setting.

In this regard, for example, the German patent application DE 10 2018 213 220 A1 discloses, inter alia, a device for deforming an optical element which comprises two piezoactuators arranged in adjacent layers, the first layer of the piezoactuators serving for coarse setting and the second layer for fine setting.

SUMMARY

The present disclosure seeks to provide an optical assembly and a projection exposure apparatus which afford an improved and further flexibilized possibility for the fine setting of manipulators or actuators. The disclosure also seeks to provide a method for correspondingly improved control of an optical assembly.

In an aspect, an optical assembly according to the disclosure for semiconductor lithography comprises at least an optical element and an actuator for deforming the optical element. In this case, the actuator is constructed from at least three sections and has at least a first and a second group of sections that are controllable in each case via a controller. In this case, the first group serves for coarse actuation and the second group serves for fine actuation. The controller is configured to control the groups independently of one another and the sections of a group jointly. The controller is configured to variably set the number of sections controlled jointly per group.

This makes it possible, for example, to set, in a manner adapted to the situation, the ratio between the maximum deflection of the actuator used for a coarse setting of the actuator and the maximum deflection of the actuator used for a fine setting of the actuator. In this regard, in a first application situation, for example, it may be expedient, in an actuator comprising six sections, to combine four sections for coarse setting to form the first group and to control same jointly. The fifth and sixth sections then form the second group and are likewise controlled jointly for fine setting. A comparatively large deflection can then be achieved via the first group, and a precise fine setting via the second group. For the case where the precision of the fine setting has to be increased further, in a second application situation, the ratio of the groups can be adapted to the effect that the first group comprises five sections, and the second group comprises one section. Assuming that the groups are embodied in an identical way, in this case the maximum deflection for the coarse setting would increase further, whereas the maximum deflection available for the fine setting would halve. In return, however, the resolution of the fine setting would double. It is likewise conceivable to variably set the number of controlled sections of only one of the two groups; this may also include for example the case in which a specific number of sections is not controlled.

In an embodiment of the disclosure, at least two sections are connected to electrodes in such a way that an individual electric field can be generated in each of the at least two sections. This means, for example, that each section is enclosed by two ground electrodes and comprises a control electrode for applying a control voltage.

Furthermore, the actuator can be configured to deform the optical element by way of a transverse contraction of the actuator. In this case, the actuator can be part of an actuator matrix, for example, which is connected in a shear-resistant manner to the optical element, such as a mirror, for example, by one end of each of the actuators. In this case, the actuator matrix is expediently connected to the rear side of the mirror facing away from the optical effective surface used for imaging. The second end of the actuators is free, and so the deformation of the mirror is brought about exclusively by the transverse contraction perpendicular to the linear expansion of the actuator, which is transmitted to the mirror via the shear-resistant linking of the actuator.

In addition, the actuator can be configured to deform the optical element on the basis of its longitudinal expansion. In this case, the actuator can be part of an actuator matrix, for example, which can be arranged between the rear side of the optical element embodied as a mirror, the rear side facing away from the optical effective surface, and a base element. If only the longitudinal expansion of the actuators is intended to contribute to the deformation of the mirror, it is often desirable for the linking to the mirror and to the base element, perpendicular to the longitudinal expansion, to be soft, i.e. transmit no forces. This can be realized either by way of a non-shear-resistant linking or by way of decoupling elements. A combination of the deformation by way of the longitudinal expansion and by the transverse contraction of the actuator is also conceivable. In this case, the actuator can be linked to the optical element in a shear-resistant manner and arranged between the optical element and a base element, which serves as an abutment for the longitudinal expansion. In this case, the base element can be embodied as flexurally stiff with a predetermined stiffness.

A projection exposure apparatus equipped with an optical assembly according to the disclosure can provide an improved imaging quality.

A method according to the disclosure for controlling an optical assembly described above, for example in a projection exposure apparatus, comprises the following method steps:
positioning the second group into an intermediate position,
determining the deviation of an optical effective surface of the optical element from a target value at a specific measurement time,
controlling the first group of the actuator in order to correct the previously determined deviation,
controlling the second group in order to correct deviations occurring after the measurement time, without the first group being actively controlled.

The first group of sections can be used to perform a first coarse correction, which usually involves a comparatively large stroke of the actuator. For this purpose, the first group can comprise for example more controlled sections than the second group. This first coarse correction can take place for example at a first measurement time after a first exposure cycle of the projection exposure apparatus, since an exposure pause, for example for a wafer change, is provided anyway after such an exposure cycle.

The deviations measured at the measurement time can thus contain the total of all deviations since the beginning of the exposure cycle. The results of the measurements after the first period of time can thus be made the basis of the control of the first region, such that the first coarse correction mentioned can already take place.

By virtue of the fact that the first group is no longer actively controlled for the correction of deviations occurring after the measurement time, but rather is kept substantially at a constant voltage and thus deflection, it is possible that only a partial region of the actuator is used for this correction. Therefore, firstly, an improved resolution of the actuator travel per voltage change can be achieved. Secondly, the influence of the hysteresis effects already mentioned above on the actuator effect can be significantly reduced, since only a portion of the actuator material or only a portion of the sections of the actuator is used for this correction, such that a possible hysteresis effect takes effect only in a reduced way.

The positioning of the second region into an intermediate position, for example a center position, can allow movement in two directions and thus a maximum flexibility with regard to desired corrections, the intermediate or center position usually being reached via a voltage being applied.

In a variant of the disclosure, the number of sections of at least one of the two groups, for example of the first group and of the second group, can be changeable. The resultant properties with regard to possible fine settings and controllability have already been explained above.

It is also conceivable for the individual sections of the two groups to be controlled with different voltages, which presupposes a corresponding number of voltage supplies in the control. Furthermore, the actuator can also comprise more than two groups.

Furthermore, the second group for fine setting can be controlled by control without a feedback variable. The expected deformation of the optical element after the measurement time and the resultant deviations from a target value can be determined by way of a model and/or a calibration in advance and by way of the detection of indirect measurement values, such as, for example, the thermal loading of the optical element as a result of being impinged on by the radiation used for imaging. The deflection of the actuator that is used for the fine correction can subsequently be determined therefrom using the second group.

The actuator can be embodied for example as a piezoelectric actuator or as an electrostrictive actuator. Such actuators usually can be constructed section by section and the individual sections can be embodied in such a way that control, i.e. for example applying a voltage, is individually possible for two groups or even for each individual section.

BRIEF DESCRIPTION OF THE DRAWINGS

Exemplary embodiments and variants of the disclosure are explained in more detail below with reference to the drawing, in which:
FIG. 5 shows a flowchart for a method according to the disclosure.

EXEMPLARY EMBODIMENTS

Figure 1:
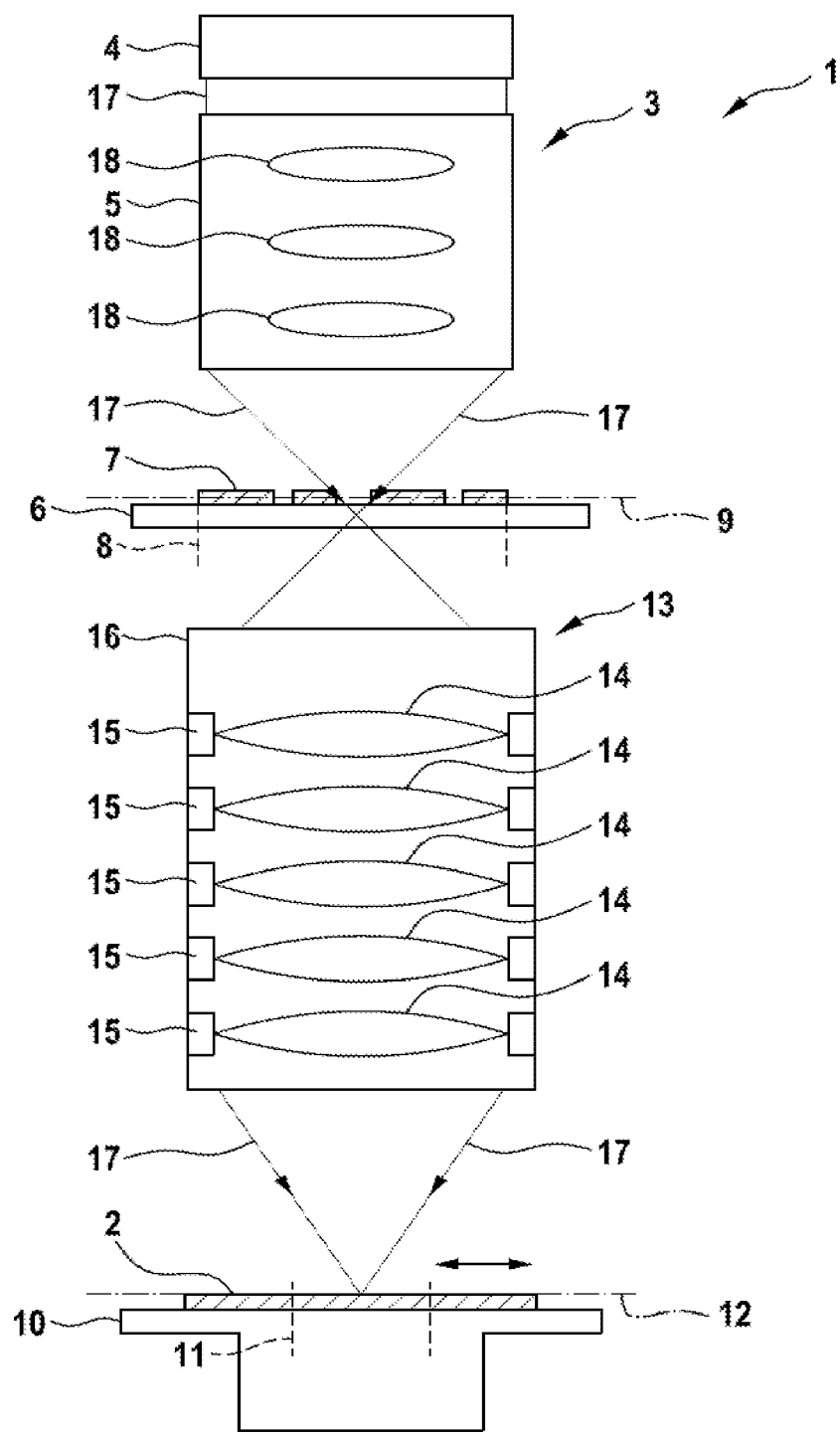
FIG. 1 shows a basic set-up of a DUV projection exposure apparatus in which the disclosure can be implemented.

FIG. 1 illustrates an exemplary projection exposure apparatus 1 in which the disclosure can be applied. The projection exposure apparatus 1 serves for the exposure of structures on a substrate which is coated with photosensitive materials, and which generally consists predominantly of silicon and is referred to as a wafer 2, for the production of semiconductor components, such as computer chips.

In this case, the projection exposure apparatus 1 substantially comprises an illumination device 3 for illuminating an object field 8 in an object plane 9, a reticle holder 6 for receiving and exactly positioning a mask provided with a structure and arranged in the object plane 9, the mask being a so-called reticle 7, which is used to determine the structures on the wafer 2, a wafer holder 10 for mounting, moving and exactly positioning precisely the wafer 2, and an imaging device, namely a projection optical unit 13, having a plurality of optical elements 14, which are held by way of mounts 15 in a lens housing 16 of the projection optical unit 13.

The basic functional principle in this case provides for the structures introduced into the reticle 7 to be imaged on the wafer 2, the imaging generally reducing the scale.

A light source 4 of the illumination device 3 provides a projection beam 17 in the form of electromagnetic radiation, the projection beam being desired for the imaging of the reticle 7 arranged in the object plane 9 onto the wafer 2 arranged in the region of an image field 11 in an image plane 12, the electromagnetic radiation being in a wavelength range of between 100 nm and 300 nm, for example. A laser, a plasma source or the like can be used as source 4 for this radiation, also referred to hereinafter as used light. The radiation is shaped via optical elements 18 in an illumination optical unit 5 of the illumination device 3 in such a way that the projection beam 17, when incident on the reticle 7 arranged in the object plane 9, illuminates the object field 8 with the desired properties with regard to diameter, polarization, shape of the wavefront and the like.

An image of the reticle 7 is generated by way of the projection beam 17 and, after having been correspondingly reduced by the projection optical unit 13, is transferred to the wafer 2 arranged in the image plane 12, as has already been explained above. In this case, the reticle 7 and the wafer 2 can be moved synchronously, so that regions of the reticle 7 are imaged onto corresponding regions of the wafer 2 virtually continuously during what is called a scanning operation. The projection optical unit 13 has a multiplicity of individual refractive, diffractive and/or reflective optical elements 14, such as for example lens elements, mirrors, prisms, terminating plates and the like, the optical elements 14 being able to be actuated for example via one or more actuator arrangements, not illustrated separately in the figure.

Figure 2:
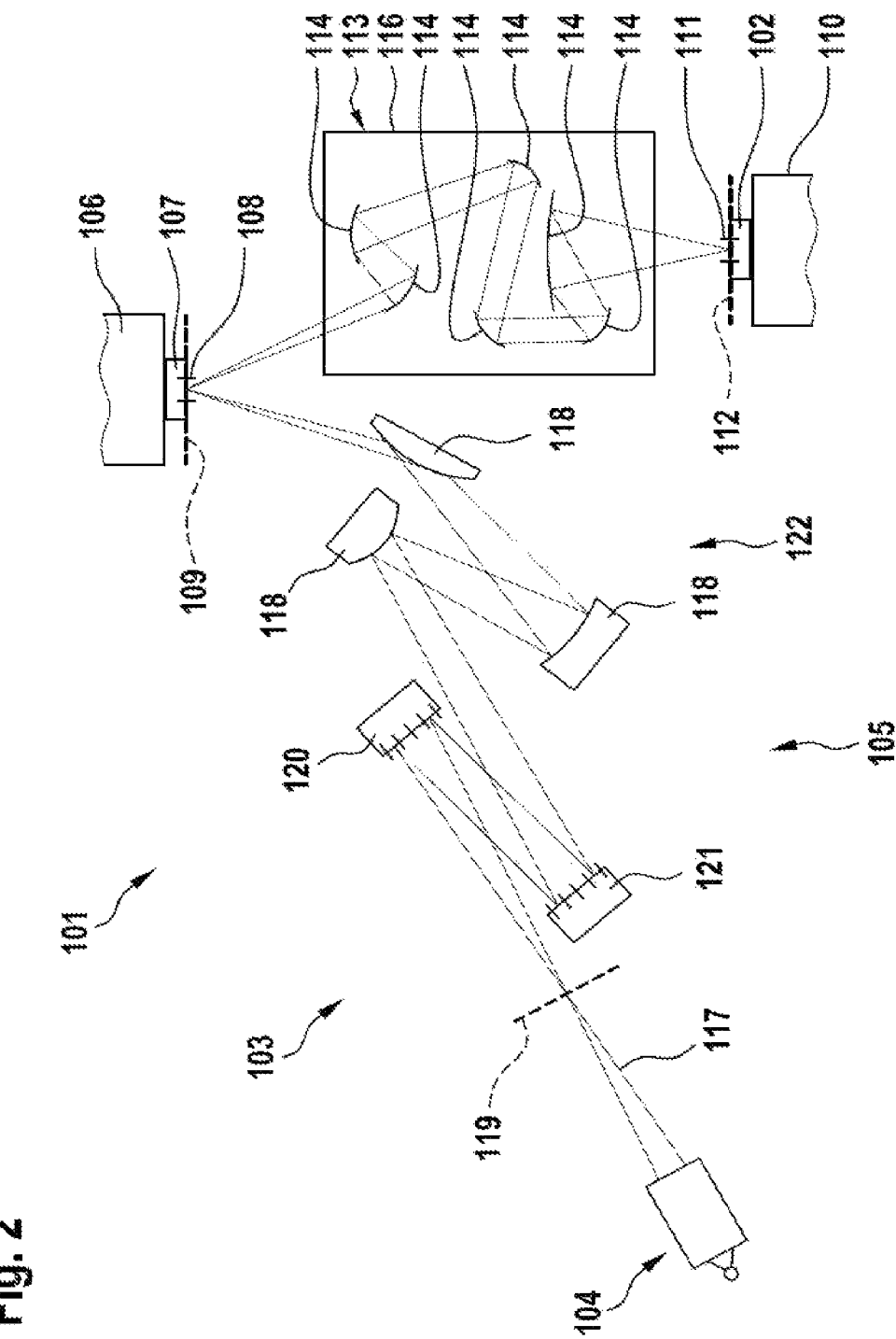
FIG. 2 shows a basic set-up of an EUV projection exposure apparatus in which the disclosure can be implemented.

FIG. 2 shows by way of example the basic set-up of a microlithographic EUV projection exposure apparatus 101 in which the disclosure can likewise find application. The set-up of the projection exposure apparatus 101 and the principle of the imaging of a structure on a reticle 107 arranged in the object plane 109 onto a wafer 102 arranged in the image plane 112 are comparable to the set-up and procedure described in FIG. 1. Identical component parts are designated by a reference sign increased by 100 relative to FIG. 1, that is to say the reference signs in FIG. 2 begin with 101. In contrast to a transmitted-light apparatus as described in FIG. 1, in an EUV projection exposure apparatus 101 only optical elements 114, 118 embodied as mirrors can be used for imaging and/or for illumination on account of the short wavelength of the EUV radiation 117 used as used light in the range of 1 nm to 120 nm, for example of 13.5 nm.

The illumination device 103 of the projection exposure apparatus 101 comprises, besides a light source 104, an illumination optical unit 105 for the illumination of the object field 108 in an object plane 109. The EUV radiation 117 in the form of optical used radiation generated by the light source 104 is aligned via a collector, which is integrated in the light source 104, in such a way that it passes through an intermediate focus in the region of an intermediate focal plane 119 before it is incident on a field facet mirror 120. Downstream of the field facet mirror 120, the EUV radiation 117 is reflected by a pupil facet mirror 121. With the aid of the pupil facet mirror 121 and an optical assembly 122 having mirrors 118, the field facets of the field facet mirror 120 are imaged into the object field 108. Apart from the use of mirrors 114, the set-up of the downstream projection optical unit 113 does not differ in principle from the set-up described in FIG. 1 and is therefore not described in further detail.

Figure 3A:
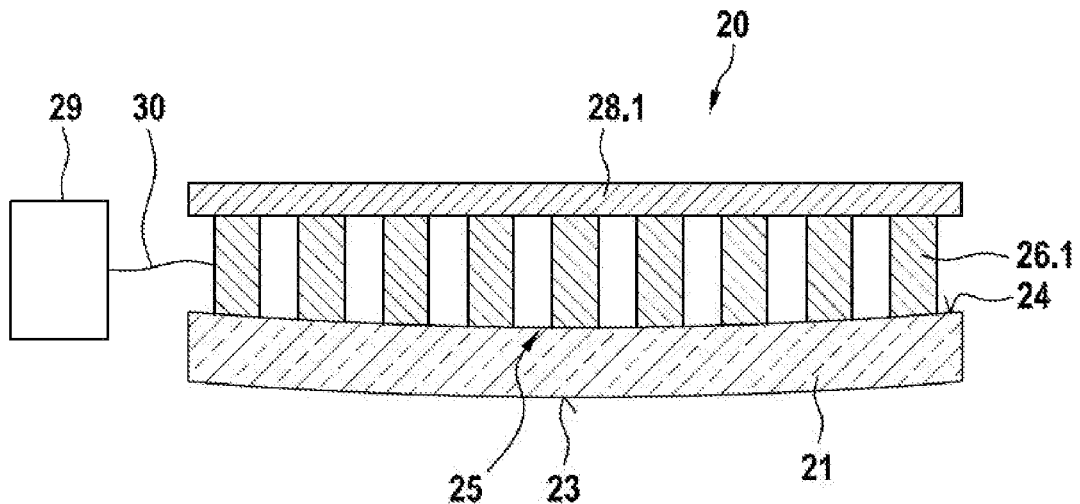
FIGS. 3A-3C show known optical assemblies.

FIG. 3A shows an optical assembly 20 according to the prior art, comprising a mirror 21 as optical element and actuators 26.1, the mirror 21 being illustrated in a deformed state. The actuators 26.1 are arranged on the rear side 24 of the mirror, corresponding to the opposite side of the mirror 21 with respect to the optical effective surface 23, in the form of an actuator matrix 25. The actuators 26.1 are connected by one end thereof to the rear side 24 of the mirror and are connected by the other end to a base element embodied as a rear plate 28.1. In the example shown, the rear plate 28.1 is very stiff and designed to absorb the reaction forces of the actuators 26.1 during the deformation of the mirror 21, without itself deforming significantly in the process. The mirror 21 is thus deformed by the expansion of the actuators 26.1 in the longitudinal direction thereof. The actuators 26.1 are connected to a controller 29 via a line 30.

Figure 3B:
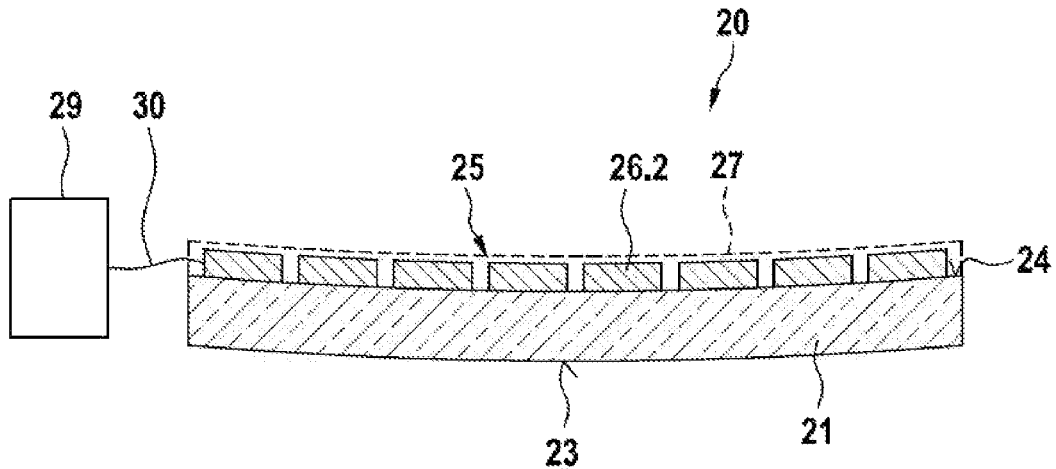

In contrast thereto, FIG. 3B shows an arrangement of the optical assembly 20 in which the actuators 26.2 are connected to the rear side 24 of the mirror 21 in a shear-resistant manner only by one end and the optical effective surface 23 is deformed. In this case, the deformation of the mirror 21 and thus of the optical effective surface 23 is caused by the transverse contraction of the actuators 26.2, i.e. the change in cross section of the actuators 26.2 during a deflection in the longitudinal direction. The end surface of the actuators 26.2 that is connected to the rear side 24 of the mirror changes, as a result of which, in the example shown, a curvature forms at the optical effective surface 23 situated opposite. The individual actuators 26.2 can also be embodied as part of an actuator layer 27 by virtue of a suitable arrangement of electrodes (not illustrated). The actuators 26.2, which are likewise arranged in an actuator matrix 25 as described in FIG. 3A, can be connected as a whole to the mirror 21.

Figure 3C:
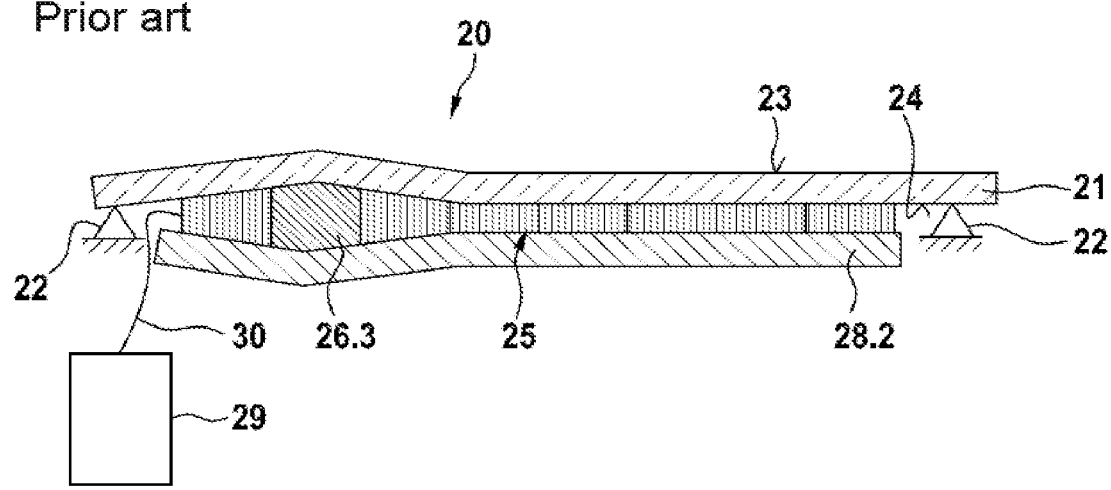

FIG. 3C shows a combination of the arrangements of the actuators 26.1, 26.2 according to the prior art as described in FIGS. 3A and 3B. The actuators 26.3 are arranged between the rear side 24 of the mirror 21 supported on a support 22 and a rear plate 28.2. The latter is embodied here in such a way that it has a stiffness of a similar order of magnitude to the stiffness of the mirror 21, that is to say that the ratio of the stiffnesses of the rear plate 28.2 and of the mirror 21 is between 1/5 and five. By virtue of this arrangement, during the actuation, the actuators 26.3 deform the mirror 21 both on account of the longitudinal effect, i.e. in the longitudinal direction of the actuator 26.3, and as a result of the transverse effect, i.e. the transverse contraction of the actuator 26.3. The ratio of the longitudinal effect and the transverse effect is dependent on the ratio of the stiffnesses of the mirror 21 and of the rear plate 28.2. The ratio also determines the breadth of the effect of the deformation, i.e. the extent of the curvature in the optical effective surface 23. As already described in FIGS. 3A and 3B, the actuators 26.3 are arranged in an actuator matrix 25 and connected to a controller 29 via a line 30.

Figure 4:
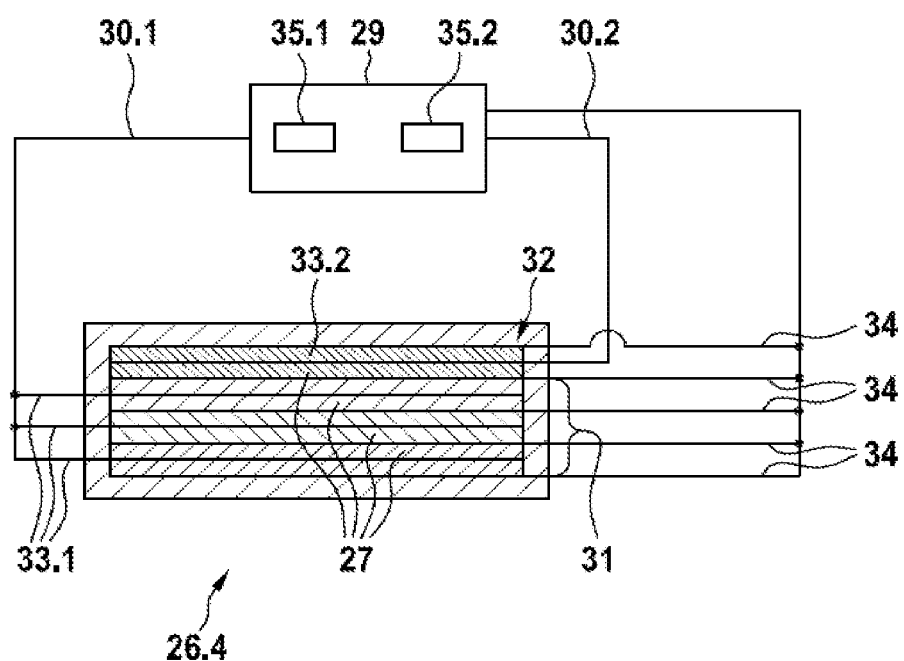
FIG. 4 shows a view of the disclosure.

FIG. 4 shows a detail view of the disclosure, illustrating an actuator 26.4 in a sectional illustration. The actuator 26.4 comprises a plurality of sections 27 embodied as actuator layers, which are subdivided into a first group 31 having three actuator layers and a second group 32 having one actuator layer. A ground electrode 34 is arranged above and below each actuator layer 27 and a control electrode 33.1 or respectively 33.2 is arranged in the center of each actuator layer 27. As a result, for each actuator layer 27, an individual electric field can be generated via the control electrode 33.1 or 33.2 connected via a line 30.1 or respectively 30.2 to a voltage supply 35.1 or respectively 35.2 of the controller 29, as a result of which the actuator layers 27 are deflected. In the circuit illustrated in FIG. 4, the control electrodes 33.1 connected to the actuator layers 27 of the first group 31 are controlled in parallel, i.e. by a common voltage supply 35.1 and hence with the same voltage. Circuits are also conceivable in which each actuator layer 27 of a group is controlled individually, as a result of which the resolution and thus the actuating accuracy can also be increased. The actuator layer 27 of the second group 32 is controlled by a control electrode 33.2, which can be controlled via the line 30.2 with a second voltage supply 35.2 of the controller 29 and thus independently of the control electrode 33.1. In the example shown, the first group 31 can be used for correction for deviations that have arisen over relatively long periods of time, which deviations are corrected at the beginning of an exposure sequence, such as, for example, the exposure of a wafer in a projection exposure apparatus 1, 101 as described in FIGS. 1 and 2. These deviations are the total of the deviations that have accumulated up to this point in time and may constitute up to 80% of the entire travel of the actuator 26.4. During the exposure sequence, the voltage of the first group 31 is kept constant and only the second group 32 is used for the correction of deviations of the shape of the optical effective surface 23 from a predetermined target value during the exposure sequence. The travels used for this, with a value of 20%, are small in comparison with the travels used by the first group 31, as a result of which a small number of actuator layers 27 is sufficient for this. With an identical voltage range and resolution of the control voltage, the smaller number of actuator layers 27 results in a greater resolution and accuracy of the travel for the correction of the deviations. The latter are usually determined by way of a model and/or a calibration, wherein influencing variables such as the shape of the illumination of the structure and/or the intensity of the radiation used for the exposure and the length of the exposure are detected and serve as input variables for the model.

FIG. 5 shows one possible method for control of an optical assembly, for example of a projection exposure apparatus, comprising an optical element and an actuator for deforming the optical element, wherein the actuator comprises a first group and a second group, each of which comprises at least one section, and a controller.

In an optional first method step 41—usually during or after the end of a preceding exposure phase—the actuator layers 27 available for the actuating can be divided into the first and second groups 31 and 32. For this purpose, the travel used during feedforward operation (control without a feedback variable) can be estimated for example in a model-based manner and be assigned to the second group 32. This is not absolutely necessary for each wafer.

In a second method step 42, the second group 32 is actuated into an intermediate position. This enables the deflection of the second group 32 in positive and negative directions for the subsequent feedforward operation. The second method step 42 can be carried out during an exposure pause.

A third method step 43 involves determining the deviation of an optical effective surface 23 of the optical element 21 from a target value at a specific measurement time. This can be effected via a measurement, for example via optical measurement of the deformation, measurement of the wavefront, measurement of the actuator extension state or some other variable that correlates with the deformation of the optical surface, but also via a prediction on the basis of an appropriate model.

A fourth method step 44 involves controlling the first group 31 of the actuator 26.4 for the correction of the deviation determined in the third method step 43. On account of the lower setting accuracy and the occurrence of non-reproducibilities and hysteresis effects of the first group 31, the set travel will deviate from the target travel, however.

For this reason, via an optional fifth method step 45, a renewed measurement of the deviation of the optical effective surface from a target value can be carried out by the methods already described above.

Afterward, in a likewise optional sixth method step 46, the actuator layers of the first or the second group 31 or 32 can be readjusted, larger residual errors being expected in the case of readjusting with the first group 31. In the case of readjusting with the second group 32, smaller residual errors are expected, but the remaining travel of the second group 32 decreases unilaterally. The more desirable variant in an individual case can be ascertained by feedforward modelling.

A seventh method step 47 involves ascertaining again the actual value for the optical effective surface. The actual value serves as a reference for the subsequent eighth method step 48, in which the second group 32 is controlled for the correction of deviations occurring after the measurement time, without the first group 31 being controlled. In this case, the eighth method step 48 can be carried out wholly or partly within an exposure phase.

LIST OF REFERENCE SIGNS

1 DUV projection exposure apparatus
2 Wafer
3 Illumination device
4 Light source
5 Illumination optical unit
6 Reticle holder
7 Reticle
8 Object field
9 Object plane
10 Wafer holder
11 Image field
12 Image plane
13 Projection optical unit
14 Optical elements (projection optical unit)
15 Mounts
16 Lens housing
17 Projection beam
18 Optical elements (illumination device)
20 Optical assembly
21 Mirror 22 Support
23 Optical effective surface
24 Rear side of the mirror
25 Actuator matrix
26.1-26.4 Actuator
27 Section (of actuator)
28.1,28.2 Rear plate
29 Controller
30.1,30.2 Line
31 First region
32 Second region
33.1,33.2 Control electrode
34 Ground electrode
35.1,35.2 Voltage supply
41 Method step 1
42 Method step 2
43 Method step 3
44 Method step 4
45 Method step 5
46 Method step 6
47 Method step 7
48 Method step 8
101 EUV projection exposure apparatus
102 Wafer
103 Illumination device
104 Light source
105 Illumination optical unit
106 Reticle holder
107 Reticle
108 Object field
109 Object plane
110 Wafer holder
111 Image field
112 Image plane
113 Projection optical unit
114 Optical elements (projection optical unit)
116 Lens housing
117 Projection beam
118 Optical elements (illumination device)
119 Intermediate focus
120 Field facet mirror
121 Pupil facet mirror
122 Optical assembly

What is claimed is:

1. An optical assembly, comprising:
an optical element comprising an optically effective surface;
an actuator configured to deform the optical element; and
a controller,
wherein:
the actuator comprises a plurality of sections;
the plurality of sections comprises a first group of sections and a second group of sections;
the first group of sections is configured to be controlled by the controller;
the second group of sections is configured to be controlled by the controller;
the first group of sections is configured to provide a first actuation of the optical element along a direction;
the sections in the first group of sections are stacked one on top of another so that the first actuation of the optical element along the direction is a sum of an individual actuation of each section in the first group of sections along the direction;
the second group of sections is configured to provide a second actuation of the optical element;
the sections in the second group of sections are stacked one on top of another so that the second actuation of the optical element along the direction is a sum of an individual actuation of each section in the second group of sections along the direction;
the second actuation of the optical element is finer than the first actuation of the optical element;
the controller is configured to control the first and second groups of sections independently of one another;
the controller is configured to jointly control the sections within the first group of sections;
the controller is configured to variably set a number of sections of the first group of sections that is jointly controlled by the controller based on a deviation of the optically effective surface of the optical element from a target value;
the controller is configured to jointly control the sections within the second group of sections; and
the controller is configured to variably set a number of sections of the second group of sections that is jointly controlled by the controller based on deviations of the optically effective surface from the target value.

2. The optical assembly of claim 1, further comprising electrodes connected to at least two sections of the actuator so that an individual electric field is generatable in each of the at least two sections of the actuator.

3. The optical assembly of claim 2, wherein the actuator is configured to deform the optical element via a transverse contraction of the actuator.

4. The optical assembly of claim 3, wherein the actuator is configured to deform the optical element via a longitudinal expansion of the actuator.

5. The optical assembly of claim 2, wherein the actuator comprises a member selected from the group consisting of a piezoelectric actuator and as an electrostrictive actuator.

6. The optical assembly of claim 1, wherein the actuator is configured to deform the optical element via a transverse contraction of the actuator.

7. The optical assembly of claim 6, wherein the actuator is configured to deform the optical element via a longitudinal expansion of the actuator.

8. The optical assembly of claim 7, wherein the actuator comprises a member selected from the group consisting of a piezoelectric actuator and as an electrostrictive actuator.

9. The optical assembly of claim 1, wherein the actuator is configured to deform the optical element via a longitudinal expansion of the actuator.

10. The optical assembly of claim 1, wherein the actuator comprises a member selected from the group consisting of a piezoelectric actuator and as an electrostrictive actuator.

11. An apparatus, comprising:
an optical assembly according to claim 1,
wherein the apparatus is a projection exposure apparatus.

12. The apparatus of claim 11, comprising an illumination optical unit and a projection optical unit, wherein the optical element of the optical assembly is part of the illumination optical unit.

13. The apparatus of claim 11, comprising an illumination optical unit and a projection optical unit, wherein the optical element of the optical assembly is part of the projection optical unit.

14. A method for controlling an optical assembly in a projection exposure apparatus, the optical assembly comprising an optical element and an actuator, the actuator comprising a plurality of sections, the plurality of sections comprising a first group of sections and a second group of sections, the sections in the first group of sections are stacked one on top of another, the sections in the second group of sections are stacked one on top of another, the method comprising:

actuating the second group of sections of the actuator into an intermediate position;

determining a deviation of an optical effective surface of the optical element from a target value at a measurement time;

selecting a number of sections in the first group of sections of the actuator to be controlled based on the deviation of the optical effective surface of the optical element determined at the measurement time so that controlling the number of sections in the first group of sections of the actuator will correct the deviation in the optical surface determined at the measurement time;

controlling the selected number of sections in the first group of sections of the actuator to correct the deviation of the optical effective surface of the optical element determined at the measurement time by moving the optical surface by a first actuation along a direction which is a sum of an individual actuation of each of the sections in the first group of sections along the direction; and without controlling the first group of sections of the actuator, controlling the second group of sections of the actuator to correct deviations of the optically effective surface from the target value occurring after the measurement time by moving the optical surface by a second actuation along the direction which is a sum of an individual actuation of each of the sections in the second group of sections along the direction.

15. The method of claim 14, further comprising, without using a feedback variable, controlling the second group of sections of the actuator.

16. The method of claim 14, wherein the actuator comprises a member selected from the group consisting of a piezoelectric actuator and as an electrostrictive actuator.

17. The method of claim 14, further comprising:

determining deviations of the optical effective surface of the optical element from a target value after the measurement time;

selecting a number of sections in the second group of sections of the actuator to be controlled based on the deviations of the optical effective surface of the optical element determined after the measurement time so that controlling the number of sections in the second group of sections of the actuator will correct the deviations in the optical surface determined after the measurement time; and without controlling the first group of sections of the actuator, controlling the selected number of sections of the second group of sections of the actuator to correct deviations occurring after the measurement time.

18. A method for controlling an optical assembly in a projection exposure apparatus, the optical assembly comprising an optical element and an actuator, the actuator comprising a plurality of sections, the plurality of sections comprising a first group of sections and a second group of sections, the sections in the second group of sections are stacked one on top of another, the method comprising:

actuating the second group of sections of the actuator into an intermediate position;

determining a deviation of an optical effective surface of the optical element from a target value at a measurement time;

controlling the first group of sections of the actuator to correct the deviation of the optical effective surface of the optical element;

determining deviations of the optical effective surface of the optical element from a target value after the measurement time;

selecting a number of sections in the second group of sections of the actuator to be controlled based on the deviations of the optical effective surface of the optical element determined after the measurement time so that controlling the number of sections in the second group of sections of the actuator will correct the deviations in the optical surface determined after the measurement time; and without controlling the first group of sections of the actuator, controlling the selected number of sections of the second group of sections of the actuator to correct deviations occurring after the measurement time by moving the optical surface by an actuation along a direction which is a sum of an individual actuation of each of the sections in the second group of sections along the direction.

19. The method of claim 17, further comprising, without using a feedback variable, controlling the second group of sections of the actuator.

20. The method of claim 17, wherein the actuator comprises a member selected from the group consisting of a piezoelectric actuator and as an electrostrictive actuator.

\* \* \* \* \*